United States Patent
Johnson et al.

[11] Patent Number: 5,164,991
[45] Date of Patent: Nov. 17, 1992

[54] VARIABLE INPUT AMPLIFIED SPEAKER WITH IMPROVED POWER INPUT SECTION

[76] Inventors: Thomas J. Johnson, 2291 Applewood La., Camarillo, Calif. 93010; James W. Lester, 1363-1 San Simeon Ct., Ventura, Calif. 93003; Dennis P. Damewood, 2203 Brookhill Dr., Camarillo, Calif. 93010

[21] Appl. No.: 479,157

[22] Filed: Feb. 13, 1990

[51] Int. Cl.$^5$ .............................................. H03F 21/00
[52] U.S. Cl. ..................................... 381/120; 330/297
[58] Field of Search ............... 381/110, 119, 120, 111, 381/188; 330/297; 323/353, 354; 363/142, 143, 45; 340/205, 358

[56] References Cited

U.S. PATENT DOCUMENTS

| | | | |
|---|---|---|---|
| 1,530,613 | 3/1925 | Pierce | 330/189 |
| 2,008,710 | 7/1935 | Hammond, Jr. et al. | 381/120 |
| 2,231,235 | 2/1941 | Weir | 381/76 |
| 2,470,542 | 5/1949 | Zimmerman | 363/45 |
| 3,371,269 | 2/1968 | Wattson | 363/45 |
| 3,499,988 | 3/1970 | Watanabe et al. | 381/120 |
| 3,555,398 | 1/1971 | Nestorovic | 363/45 |
| 4,052,561 | 10/1977 | Molay | 381/76 |
| 4,258,332 | 3/1981 | West | 381/120 |
| 4,264,901 | 4/1981 | Petersen et al. | 340/604 |
| 4,270,061 | 5/1981 | Gronner | |
| 4,484,150 | 11/1984 | Carver | 330/297 |
| 4,625,328 | 11/1986 | Freadman | 381/111 |
| 4,780,805 | 10/1988 | Chewuk et al. | 363/142 |
| 4,891,842 | 1/1990 | Green | 381/188 |
| 4,937,731 | 6/1990 | Konopka | 363/143 |
| 4,987,385 | 1/1991 | Engelmann | 381/120 |
| 5,065,074 | 11/1991 | Hesketh et al. | 315/209 R |

Primary Examiner—Forester W. Isen
Attorney, Agent, or Firm—Antonelli, Terry, Stout & Kraus

[57] ABSTRACT

An amplified speaker has an amplifier section including an audio amplifier powered from a power input section and a variable audio input section for supplying an input audio signal via an audio transformer to the audio amplifier. The power input section includes a rectifier bridge and a capacitor filter circuit, so that power may be obtained from an inexpensive unregulated AC source rather than an expensive regulated DC power supply. The variable audio input section permits audio signals at various levels from 30 mVrms to 70.7 Vrms to be inputted.

7 Claims, 2 Drawing Sheets

VARIABLE INPUT AMPLIFIED SPEAKER WITH IMPROVED POWER INPUT SECTION

BACKGROUND OF THE INVENTION

The present invention is directed in general to amplified speakers, of the type in which an amplifier is directly mounted on or within the enclosure of an electroacoustic speaker.

Amplified speakers are used mainly in applications where a local amplifier is limited in output power. Examples are the amplified speaker V-1020 C and other models marketed by Valcom of Roanoke, Va. The amplified speaker increases the capabilities of the local amplifier by providing remote amplification of signals at the speaker using AC power available at that location and on-board amplifiers that require very little of the power of the local amplifier.

Amplified speakers also find use in applications not requiring a local amplifier or where a local amplifier is not available, such as in various telephone applications. For example, many PABXs have what are called 600 Ohm ports which act as extensions where it is possible to connect the input of an amplified speaker via a twisted pair to call u the extension and initiate a page message. In such a case, a local amplifier is not required, since the amplified speaker may be hooked up directly to the 600 Ohm port.

The amplified speakers which are currently available commercially, while providing satisfactory operation in general, have certain drawbacks and operational limitations which render them less than desirable for all applications. In particular, presently available amplified speakers are expensive, are characterized by inefficient power transfer which limits the number of speakers capable of being powered from one power source and are typically capable of accommodating only a standard 30 mVrms to 1 Vrms (600 Ohms) audio source. These disadvantages result from the fact that currently available amplified speakers operate from an expensive 24 volts DC regulated power supply and that the input audio signal matching is limited to the standard 600 Ohm telephone signal levels only. In addition to being expensive, the regulated power supply also has an inherent inefficient power transfer characteristic, thereby limiting the number of speakers capable of being powered from the power source.

SUMMARY OF THE INVENTION

It is an object of the present invention to provide an improved amplified speaker which avoids the disadvantages inherent in the amplified speakers which are presently commercially available.

This object is achieved in accordance with the present invention by eliminating a need for the previously utilized regulated power supply by incorporating into the amplified speaker as a power input section an on-board bridge rectifier and capacitor filter, thereby allowing use of a less expensive 12 volt AC transformer as the power supply. With this improved power input section, a standard 120 VAC to 12 VAC unregulated power supply can be used, thereby eliminating need for the more expensive 120 VAC to 24 VDC regulated power supply employed in the presently available amplified speaker.

The present invention is also characterized by the provision of a variable audio input section employing precision resistors to permit use of the amplified speaker with a variety of input sources, including 70.7 Vrms, 25 Vrms, 3.5 Vrms or 30 mVrms (600 Ohm). This is in contrast to the presently available commercial amplified speaker which is designed to accommodate only an audio source of 30 mVrms to 1 Vrms (600 Ohms). Thus, the amplified speaker of the present invention has a wider range of application in providing for connection to a variety of input sources.

These and other objects, features and advantages of the present invention will become more apparent from the following detailed description, which refers to an embodiment illustrated in the accompanying drawings.

DETAILED DESCRIPTION OF THE PREFERRED EMBODIMENT

Figure 1:
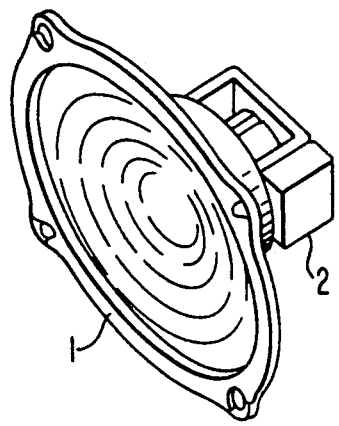
FIG. 1 is a view in perspective of a typical amplified speaker.

FIG. 1 shows an example of a typical amplified speaker including an electroacoustic speaker 1 having an amplifier section 2 mounted thereon. The amplifier section 2 may be provided as an encapsulated unit, as shown, or it may simply consist of a printed circuit board with the necessary electronics mounted on and connected to input terminals of the speaker 1. In those applications where the speaker is mounted in an enclosure, such a disk speakers of the type associated with telephone systems, the amplifier section may be mounted within the speaker enclosure in any convenient manner. Further, with regard to horn speakers and other speakers having a housing or outer casing, the amplifier section 2 may be mounted within the speaker casing, to provide for weatherproofing of the electronics or to render the speaker explosion-proof.

The electroacoustic speaker 1 may be any conventional speaker, including standard 8 Ohm, 70 volt and 45 Ohm, 6.7 volt eight inch voice coil speakers, such as the speakers marketed by Harris/Dracon as the "P-TEC/-Lites Series 700" speakers, as well as various types of horn loudspeakers.

Figure 2:
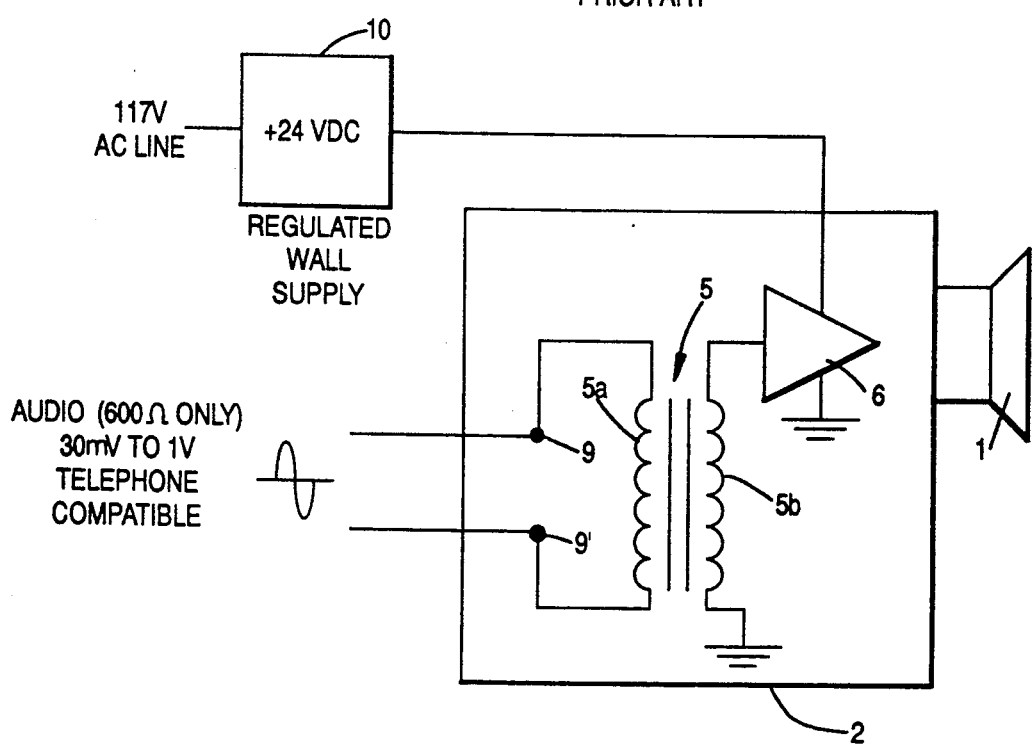
FIG. 2 is a schematic circuit diagram of a conventional amplified speaker.

As can be seen in FIG. 2, the amplifier section 2 of the conventional amplified speaker includes an audio transformer 5 having a primary winding 5a connected across a pair of input terminals 9, 9' and a secondary winding 5b connected to the input of an amplifier 6. The amplifier 6 receives power from a 24 VDC regulated wall supply 10 powered from a 117 volt AC line supply.

The amplified speaker illustrated in FIG. 2 is telephone compatible and is capable of receiving an audio input signal in the 30 mV to 1 V (600 Ohm) range, so as to be connectable directly to a 600 Ohm port of a PABX, for example. However, this conventional amplified speaker has the disadvantage of requiring a rather expensive regulated power supply 10, and is limited in its application since it is capable of working only with a 30 mV to 1 V audio input signal.

Figure 3:
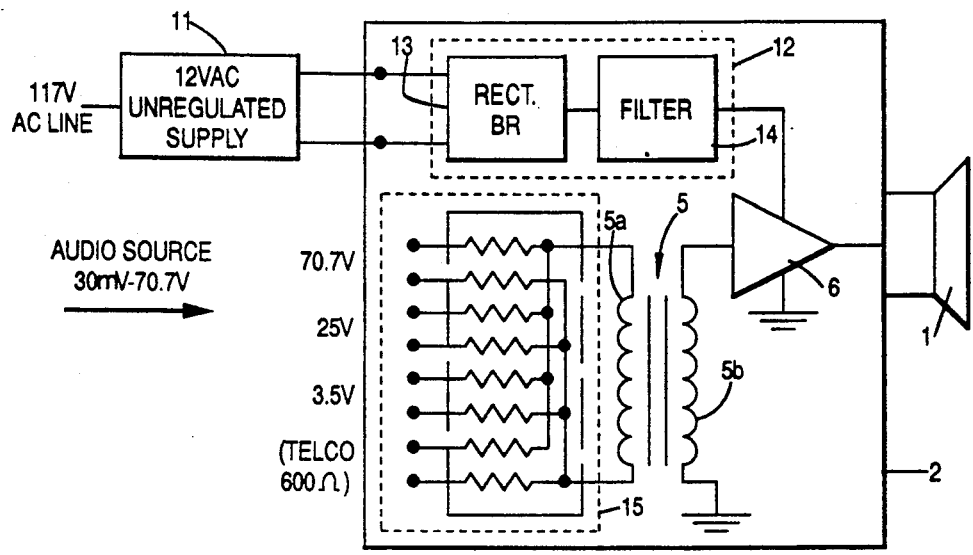
FIG. 3 is a schematic circuit diagram of the amplified speaker in accordance with the present invention.

The amplified speaker of the present invention, as seen in FIG. 3, also includes an electro-acoustic speaker 1 and amplifier section 2; however, the amplifier section 2 is improved to avoid the inherent disadvantageous features of the conventional amplified speaker. In particular, the amplifier 6 within the amplifier section 2 is powered from a power input section 12, including a rectifier bridge 13 and filter 14, connected to receive power from 12 VAC unregulated power supply 11. With this improved power input section 12, the need to power the amplified speaker from an expensive regulated power supply is avoided, thereby providing a more cost effective arrangement.

A second improvement in the amplifier section 2 of the amplified speaker of the present invention resides in the variable audio input section 15 connected to the transformer 5. The input section 15 includes a plurality of pairs of input terminals connected via precision resistors to the primary winding 5a of the transformer 5 so as to allow use of the amplified speaker with a variety of input sources at 70.7 Vrms, 25 Vrms, 3.5 Vrms or 30 mVrms (600 Ohm). In this regard, the industry standard public address amplifiers typically have four different output levels and can provide one or a combination of output levels at 70.7 Vrms, 25 Vrms, 3.5 Vrms and 30 mVrms. With the variable audio input section 15, the amplified speaker of the present invention becomes more versatile and compatible for use with different audio input levels.

Figure 4:
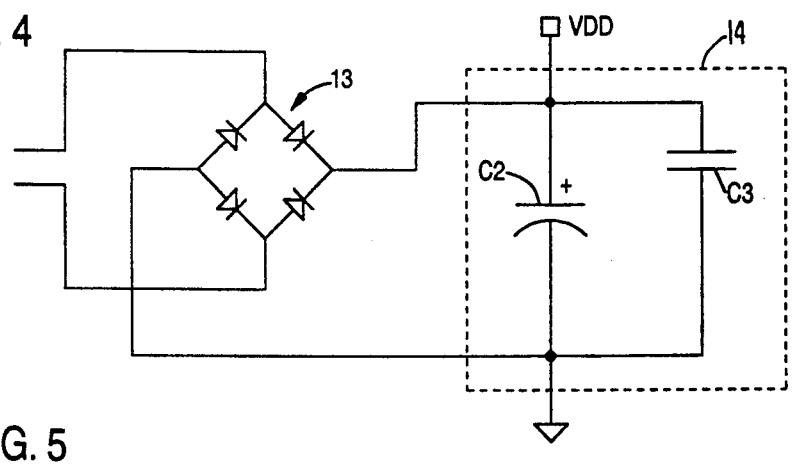
FIG. 4 is a schematic circuit diagram showing the details of the power input section of the amplified speaker of FIG. 3.

The details of the power input section 12 are shown in FIG. 4. The rectifier bridge 13 is connected to a pair of input terminals to receive power from the 12 VAC unregulated power supply and has a dual function in the power input section 12. First of all, the bridge rectifier 13 operates to rectify the received AC voltage from the unregulated power supply 11 to provide a DC voltage to power the amplifier 6. The second function is to provide a polarity guard in the case where the wrong transformer (AC volts to DC volts) is used in the power supply 11.

The filter 14 provided in the power input section 12 includes an electrolytic capacitor C2 which operates to filter the low frequency AC ripple, and a ceramic capacitor C3 which operates to filter any high frequency noise that may be present. In a specific example, the electrolytic capacitor C2 may be a 3300 μF capacitor and the ceramic capacitor C3 may be 0.1 μF.

Figure 5:
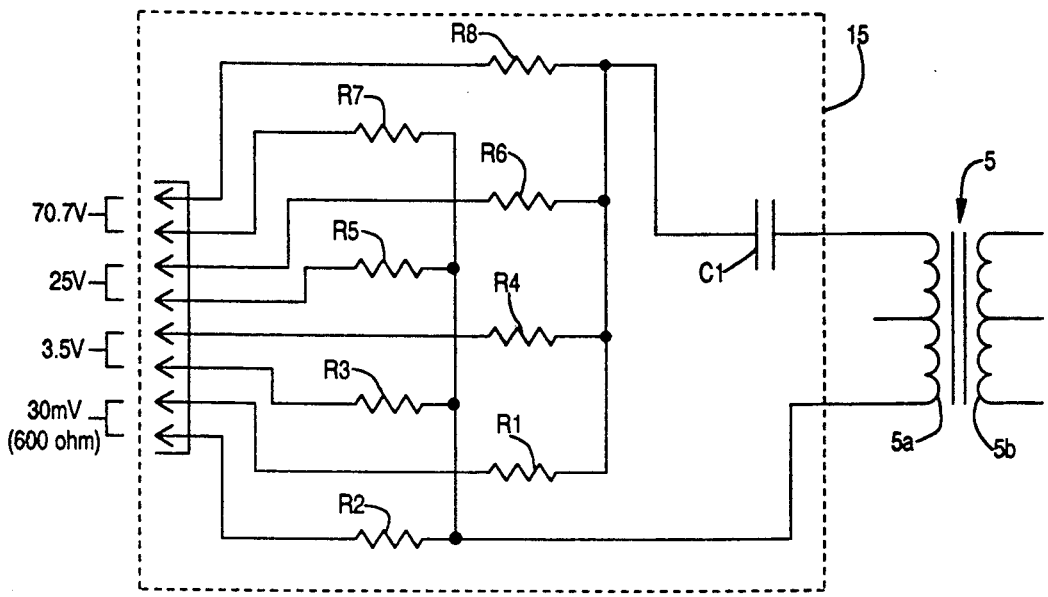
FIG. 5 is a circuit diagram showing details of the variable audio input section of the amplified speaker of FIG. 3.

FIG. 5 illustrates the details of the variable audio input section 15. As can be seen, there are four separate audio paths provided in the variable audio input section, each path being identical in function with the only difference being the value of the resistors R1-R8 that attenuate the signal and provide a balanced input for each of the respective audio paths. Each of the four separate audio paths also is connected through a capacitor C1 to the primary winding 5a of the audio transformer 5. An audio input signal (30 mVrms, 3.5 Vrms, 25 Vrms or 70.7 Vrms) will be applied to the appropriate locations of the input connector to select the proper input audio path. The inputted signal will then be attenuated equally across the precision resistors with transformer 5 operating as the load and capacitor C1 operating as a DC voltage blocking capacitor.

The precision resistors in the variable audio input section 15 may take the following exemplary values:

| | |
|---|---|
| R1, R2 | 51.1 Ohms |
| R3, R4 | 16.2K Ohms |
| R5, R6 | 82.5K Ohms |
| R7, R8 | 249K Ohms |

The amplifier 6 provided in the amplifier section 2 of the amplified speaker of the present invention may be any conventional amplifier of the type typically used in this type of device.

As can be seen from the foregoing description in connection with the preferred embodiment illustrated in the drawings, the present invention provides distinct advantages over the conventional amplified speaker in eliminating the need for an expensive regulated power supply and by accommodating a plurality of audio input paths to permit use of the amplified speaker with a variety of input sources at different voltage levels. The provision of a power input section which includes an on-board bridge rectifier and capacitor filter allows the use of a less expensive 12 volt AC transformer in place of the more expensive regulated power supply required by the conventional amplified speaker. Further, the addition of multiple balanced attenuator networks in the audio input section allows operation from various levels of input signal up to 70.7 volts rms for line distribution systems While we have shown and described an embodiment in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:

1. An amplified speaker comprising a speaker device having an electro-acoustic speaker and an amplifier section mounted with said speaker, said amplifier section including an audio amplifier having an output connected to said speaker and a power input section connected to said audio amplifier to supply power thereto, said power input section comprising a rectifier bridge connected to a filter circuit, so that said audio amplifier may be powered via said power input section from an unregulated AC power supply, wherein said amplifier section is mounted directly on a structural part of said speaker.

2. An amplified speaker according to claim 1, wherein said filter circuit comprises an electrolytic capacitor for filtering low frequency AC ripple connected in parallel to a ceramic capacitor for filtering high frequency noise.

3. An amplified speaker comprising a speaker device having an electro-acoustic speaker and an amplifier section mounted with said speaker, said amplifier section including an audio amplifier having an output connected to said speaker for amplifying a received audio frequency signal, an audio input section through which an audio input signal is supplied and an audio transformer connected between said audio input section and said audio amplifier, said audio input section having a plurality of input audio signal paths for receiving different levels of input signal, each path comprising balanced resistors to attenuate a received input signal at a rated level of the signal path to a common level for application via said audio transformer to said audio amplifier, wherein said input audio signal paths include paths at the rated levels of 70.7 Vrms, 25 Vrms, 3.5 Vrms and 30 mVrms.

4. An amplified speaker comprising a speaker device having an electro-acoustic speaker and an amplifier section mounted with said speaker, said amplifier section including an audio amplifier having an output connected to said speaker for amplifying a received audio frequency signal, an audio input section through which an audio input signal is supplied and an audio transformer connected between said audio input section and said audio amplifier, said audio input section having a plurality of input audio signal paths for receiving different levels of input signal, each path comprising balanced resistors to attenuate a received input signal at a rated level of the signal path to a common level for application via said audio transformer to said audio amplifier, wherein said amplifier section is mounted directly on a structural part of said speaker.

5. An amplified speaker according to claim 4, wherein said amplifier section further includes a power input section connected to said audio amplifier to supply power thereto, said power input section comprising a rectifier bridge connected to a filter circuit, so that said audio amplifier may be powered via said power input section from an unregulated power supply.

6. An amplified speaker according to claim 5, wherein said filter circuit comprises an electrolytic capacitor for filtering low frequency AC ripple connected in parallel to a ceramic capacitor for filtering high frequency noise.

7. An amplified speaker according to claim 5, wherein said input audio signal paths include paths at the rated levels of 70.7 Vrms, 25 Vrms, 3.5 Vrms and 30 mVrms.

* * * * *